(12) United States Patent
Liu et al.

(10) Patent No.: US 11,238,803 B2
(45) Date of Patent: Feb. 1, 2022

(54) PIXEL CIRCUIT AND METHOD FOR DRIVING THE SAME, AND DISPLAY PANEL

(71) Applicant: BOE Technology Group Co., Ltd., Beijing (CN)

(72) Inventors: Weixing Liu, Beijing (CN); Tieshi Wang, Beijing (CN); Zhiqiang Xu, Beijing (CN); Shengnan Li, Beijing (CN); Wanpeng Teng, Beijing (CN); Chunfang Zhang, Beijing (CN); Xiaolong Li, Beijing (CN); Wei Qin, Beijing (CN); Kai Guo, Beijing (CN); Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/271,776

(22) PCT Filed: Jul. 22, 2020

(86) PCT No.: PCT/CN2020/103554
§ 371 (c)(1),
(2) Date: Feb. 26, 2021

(87) PCT Pub. No.: WO2021/027514
PCT Pub. Date: Feb. 18, 2021

(65) Prior Publication Data
US 2021/0327357 A1    Oct. 21, 2021

(30) Foreign Application Priority Data

Aug. 14, 2019   (CN) .......................... 201910752533.8

(51) Int. Cl.
*G09G 3/3258*   (2016.01)
*H01L 27/32*   (2006.01)
*H01L 51/50*   (2006.01)

(52) U.S. Cl.
CPC ....... *G09G 3/3258* (2013.01); *H01L 27/3244* (2013.01); *H01L 51/504* (2013.01);
(Continued)

(58) Field of Classification Search
CPC ... G09G 2300/0426; G09G 2310/0224; G09G 2320/0214; G09G 2320/0247
See application file for complete search history.

(56) References Cited

U.S. PATENT DOCUMENTS

| 5,917,280 A | 6/1999 | Burrows et al. |
| 7,561,124 B2 | 7/2009 | Kwak et al. |

(Continued)

FOREIGN PATENT DOCUMENTS

| CN | 1617206 A | 5/2005 |
| CN | 101127194 A | 2/2008 |

(Continued)

OTHER PUBLICATIONS

First Office Action, including Search Report, for Chinese Patent Application No. 201910752533.8, dated Jun. 28, 2020, 32 pages.

*Primary Examiner* — Shaheda A Abdin
(74) *Attorney, Agent, or Firm* — Westman, Champlin & Koehler, P.A.

(57) ABSTRACT

The present disclosure provides a pixel circuit and a method for driving the same, and a display panel. The pixel circuit includes a driving sub-circuit and a light-emitting control sub-circuit. The driving sub-circuit is configured to transmit a first power voltage at a first power signal terminal to a second node. The light-emitting control sub-circuit is configured to: transmit a voltage at the second node and a second power voltage at the second power signal terminal to the first electrode of the first light-emitting element and the second electrode of the first light-emitting element respectively in a first period, to the first electrode of the second (Continued)

light-emitting element and the second electrode of the second light-emitting element respectively in a second period, and to the first electrode of the third light-emitting element and the second electrode of the third light-emitting element respectively in a third period.

17 Claims, 11 Drawing Sheets

(52) U.S. Cl.
CPC ............... *G09G 2300/0426* (2013.01); *G09G 2300/0809* (2013.01); *G09G 2320/0233* (2013.01); *G09G 2330/02* (2013.01)

(56) References Cited

U.S. PATENT DOCUMENTS

| | | | |
|---|---|---|---|
| 7,570,236 | B2 | 8/2009 | Han et al. |
| 9,773,983 | B2 | 9/2017 | Kang et al. |
| 9,881,549 | B2 | 1/2018 | Li et al. |
| 10,504,427 | B2 | 12/2019 | Yang et al. |
| 10,756,140 | B2 | 8/2020 | Yang et al. |
| 10,783,830 | B1* | 9/2020 | Lu .................... H01L 27/3262 |
| 10,811,475 | B2 | 10/2020 | Zhang et al. |
| 10,909,924 | B2 | 2/2021 | Yang et al. |
| 2005/0104875 | A1 | 5/2005 | Kwak et al. |
| 2005/0264550 | A1* | 12/2005 | Ohshima .............. G09G 3/3233 345/204 |
| 2007/0126680 | A1 | 6/2007 | Han et al. |
| 2015/0187270 | A1* | 7/2015 | Lee ...................... G09G 3/3266 345/76 |
| 2016/0104430 | A1* | 4/2016 | Park ..................... G09G 3/3233 345/204 |
| 2016/0104844 | A1 | 4/2016 | Kang et al. |
| 2016/0293083 | A1* | 10/2016 | Yang .................... G09G 3/2003 |
| 2017/0018223 | A1 | 1/2017 | Li et al. |
| 2019/0267436 | A1 | 8/2019 | Zhang et al. |
| 2019/0279565 | A1 | 9/2019 | Yang et al. |
| 2020/0243003 | A1 | 7/2020 | Yang et al. |
| 2020/0243614 | A1 | 7/2020 | Yang et al. |

FOREIGN PATENT DOCUMENTS

| | | |
|---|---|---|
| CN | 104599641 A | 5/2015 |
| CN | 105514287 A | 4/2016 |
| CN | 106449659 A | 2/2017 |
| CN | 107068057 A | 8/2017 |
| CN | 107342047 A | 11/2017 |
| CN | 208225917 U | 12/2018 |
| CN | 109564931 A | 4/2019 |
| CN | 110060637 A | 7/2019 |
| CN | 110428778 A | 11/2019 |
| KR | 101214205 B1 | 12/2012 |

* cited by examiner

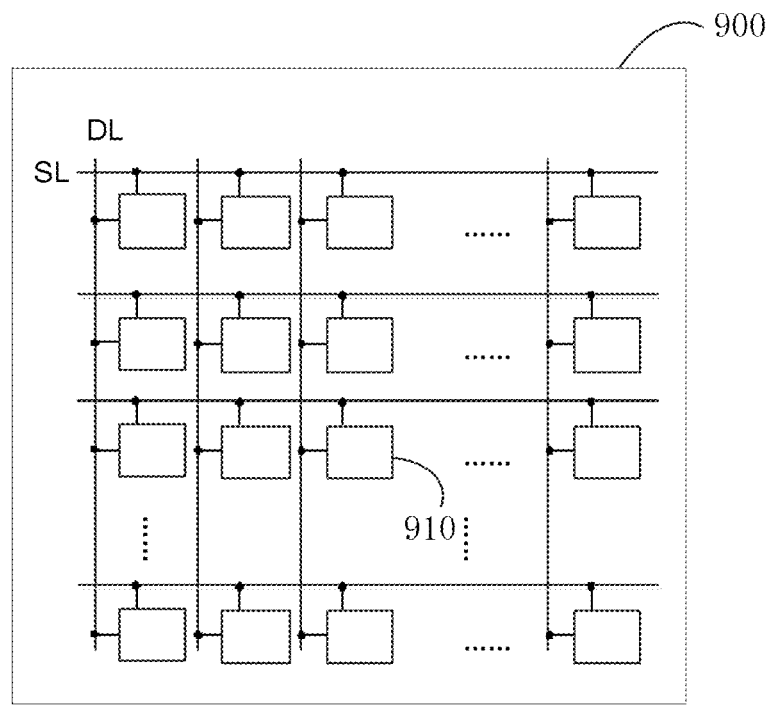

```
┌─────────────────────────────────────────┐
│ In the light-emitting phase of the      │  S1010
│ first period, a first light-emitting    │
│ control signal being at a second level  │
│ is provided, and a second light-emitting│
│ control signal and a third light-       │
│ emitting control signal each being at a │
│ first level are provided                │
└─────────────────────────────────────────┘
                    ↓
┌─────────────────────────────────────────┐
│ In the light-emitting phase of the      │  S1020
│ second period, a second light-emitting  │
│ control signal being at a second level  │
│ is provided, and a first light-emitting │
│ control signal and a third light-       │
│ emitting control signal each being at a │
│ first level are provided                │
└─────────────────────────────────────────┘
                    ↓
┌─────────────────────────────────────────┐
│ In the light-emitting phase of the      │  S1030
│ third period, a third light-emitting    │
│ control signal being at a second level  │
│ is provided, and a first light-emitting │
│ control signal and a second light-      │
│ emitting control signal each being at a │
│ first level are provided                │
└─────────────────────────────────────────┘
```

FIG. 10

PIXEL CIRCUIT AND METHOD FOR DRIVING THE SAME, AND DISPLAY PANEL

CROSS-REFERENCE TO RELATED APPLICATION(S)

This Application is a Section 371 National Stage Application of International Application No. PCT/CN2020/103554, filed on Jul. 22, 2020, which published as WO 2021/027514 A1 on Feb. 18, 2021, not in English, and claims priority to Chinese Patent Application No. 201910752533.8, filed on Aug. 14, 2019, the disclosures of which are incorporated herein by reference in their entireties.

TECHNICAL FIELD

The present disclosure relates to a field of display technology, and in particular to a pixel circuit and a method for driving the pixel circuit, and a display panel.

BACKGROUND

In a conventional organic light-emitting diode (OLED) display, sub-pixels of different colors in each pixel unit are arranged laterally on a panel, which occupy a large space of the panel.

SUMMARY

According to a first aspect of the present disclosure, a pixel circuit is provided, including: a driving sub-circuit electrically coupled to a first node, a first power signal terminal and a second node, and configured to transmit a first power voltage at the first power signal terminal to the second node under control of a voltage at the first node; and a light-emitting control sub-circuit electrically coupled to the second node, a second power signal terminal, a first light-emitting control terminal, a second light-emitting control terminal, a third light-emitting control terminal, a first electrode of a first light-emitting element, a second electrode of the first light-emitting element, a first electrode of a second light-emitting element, a second electrode of the second light-emitting element, a first electrode of a third light-emitting element and a second electrode of the third light-emitting element, and configured to: transmit a voltage at the second node and a second power voltage at the second power signal terminal to the first electrode of the first light-emitting element and the second electrode of the first light-emitting element respectively in a first period, transmit a voltage at the second node and a second power voltage at the second power signal terminal to the first electrode of the second light-emitting element and the second electrode of the second light-emitting element respectively in a second period, and transmit a voltage at the second node and a second power voltage at the second power signal terminal to the first electrode of the third light-emitting element and the second electrode of the third light-emitting element respectively in a third period, under control of a first light-emitting control signal from the first light-emitting control terminal, a second light-emitting control signal from the second light-emitting control terminal, and a third light-emitting control signal from the third light-emitting control terminal.

In some embodiments, the light-emitting control sub-circuit includes: a first transistor having a control electrode electrically coupled to the second light-emitting control terminal, a first electrode electrically coupled to the second node, and a second electrode electrically coupled to a fourth node; a second transistor having a control electrode electrically coupled to the first light-emitting control terminal, a first electrode electrically coupled to the second node, and a second electrode electrically coupled to the first electrode of the first light-emitting element; a third transistor having a control electrode electrically coupled to the third light-emitting control terminal, a first electrode electrically coupled to the second node, and a second electrode electrically coupled to a fifth node; a fourth transistor having a control electrode electrically coupled to the first light-emitting control terminal, a first electrode electrically coupled to the fourth node, and a second electrode electrically coupled to the second power signal terminal; and a fifth transistor having a control electrode electrically coupled to the second light-emitting control terminal, a first electrode electrically coupled to the fifth node, and a second electrode electrically coupled to the second power signal terminal, wherein the second electrode of the first light-emitting element is electrically coupled to the first electrode of the second light-emitting element via the fourth node, the second electrode of the second light-emitting element is electrically coupled to the first electrode of the third light-emitting element via the fifth node, and the second electrode of the third light-emitting element is electrically coupled to the second power signal terminal.

In some embodiments, the light-emitting control sub-circuit includes: a first transistor having a control electrode electrically coupled to the second light-emitting control terminal, a first electrode electrically coupled to the second node, and a second electrode electrically coupled to a fourth node; a second transistor having a control electrode electrically coupled to the third light-emitting control terminal, a first electrode electrically coupled to the second electrode of the third light-emitting element, and a second electrode electrically coupled to the second power signal terminal; a third transistor having a control electrode electrically coupled to the third light-emitting control terminal, a first electrode electrically coupled to the second node, and a second electrode electrically coupled to a fifth node; a fourth transistor having a control electrode electrically coupled to the first light-emitting control terminal, a first electrode electrically coupled to the fourth node, and a second electrode electrically coupled to the second power signal terminal; and a fifth transistor having a control electrode electrically coupled to the second light-emitting control terminal, a first electrode electrically coupled to the fifth node, and a second electrode electrically coupled to the second power signal terminal, wherein the first electrode of the first light-emitting element is electrically coupled to the second node, the second electrode of the first light-emitting element is electrically coupled to the first electrode of the second light-emitting element via the fourth node, and the second electrode of the second light-emitting element is electrically coupled to the first electrode of the third light-emitting element via the fifth node.

In some embodiments, the driving sub-circuit includes a sixth transistor having a control electrode electrically coupled to the first node, a first electrode electrically coupled to the first power signal terminal, and a second electrode electrically coupled to the second node.

In some embodiments, the pixel circuit further includes: a storage sub-circuit electrically coupled between the first node and the third node; a charging control sub-circuit electrically coupled to a scan signal terminal, a data signal terminal, the first node, the second node and the third node, and configured to generate a voltage difference between the first node and the third node under control of a first scan voltage at the scan signal terminal; and a reset sub-circuit electrically coupled to a first reset control terminal, a second reset control terminal, the third node and a reset voltage signal terminal, and configured to, under control of a first reset control signal from the first reset control terminal or a second reset control signal from the second reset control terminal, reset the third node by using a reset voltage signal from the reset voltage signal terminal.

In some embodiments, the storage sub-circuit includes a first capacitor having a first terminal electrically coupled to the third node, and a second terminal electrically coupled to the first node.

In some embodiments, the charging control sub-circuit includes: a seventh transistor having a control electrode electrically coupled to the scan signal terminal, a first electrode electrically coupled to the data signal terminal, and a second electrode electrically coupled to the third node; and an eighth transistor having a control electrode electrically coupled to the scan signal terminal, a first electrode electrically coupled to the first node, and a second electrode electrically coupled to the second node.

In some embodiments, the reset sub-circuit includes: a ninth transistor having a control electrode electrically coupled to the first reset control terminal, a first electrode electrically coupled to the reset voltage signal terminal, and a second electrode electrically coupled to the third node; and a tenth transistor having a control electrode electrically coupled to the second reset control terminal, a first electrode electrically coupled to the reset voltage signal terminal, and a second electrode electrically coupled to the third node.

In some embodiments, the scan signal terminal is configured to receive a scan signal for a current row of pixels, the first reset control terminal is configured to receive a scan signal for a previous row of pixels, and the second reset control terminal is configured to receive a scan signal for a next row of pixels.

According to a second aspect of the present disclosure, a display panel including a plurality of pixel units is provided, wherein at least one pixel unit of the plurality of pixel units includes the pixel circuit described above In some embodiments, each of the at least one pixel unit includes: a substrate; a control circuit layer arranged on the substrate, wherein the control circuit layer includes the driving sub-circuit and the light-emitting control sub-circuit; an intermediate layer arranged on a side of the control circuit layer away from the substrate, and configured to cover the control circuit layer; a first electrode layer, a first light-emitting layer, a second electrode layer, a second light-emitting layer, a third electrode layer, a third light-emitting layer and a fourth electrode layer sequentially stacked on the intermediate layer, wherein the first light-emitting layer, the second light-emitting layer and the third light-emitting layer are used as a first light-emitting element, a second light-emitting element and a third light-emitting element respectively.

In some embodiments, the substrate includes a first area and a second area that do not overlap each other; projections of at least a part of the driving sub-circuit and at least a part of the light-emitting control sub-circuit on the substrate are located in the first area; and projections of at least a part of the first electrode layer, the first light-emitting layer, at least a part of the second electrode layer, the second light-emitting layer, at least a part of the third electrode layer, the third light-emitting layer and at least a part of the fourth electrode layer on the substrate are located in the second area.

In some embodiments, each of the first electrode layer, the second electrode layer and the third electrode layer is electrically coupled to the light-emitting control sub-circuit through a through hole penetrating the intermediate layer.

In some embodiments, the first electrode layer comprises an opaque material, and the second electrode layer, the third electrode layer and the fourth electrode layer each comprises a transparent material.

According to a third aspect of the present disclosure, a method for driving the pixel circuit described above is provided, wherein each of the first period, the second period and the third period includes an initialization phase, a charging phase and a light-emitting phase, and the method comprises: providing a first light-emitting control signal being at a second level and providing a second light-emitting control signal and a third light-emitting control signal each being at a first level in the light-emitting phase of the first period; providing a second light-emitting control signal being at a second level and providing a first light-emitting control signal and a third light-emitting control signal each being at a first level in the light-emitting phase of the second period; providing a third light-emitting control signal being at a second level and providing a first light-emitting control signal and a second light-emitting control signal each being at a first level in the light-emitting phase of the third period; and providing a first light-emitting control signal, a second light-emitting control signal and a third light-emitting control signal each being at a first level in the initialization phase and the charging phase of each of the first period, the second period and the third period.

According to a fourth aspect of the present disclosure, a display panel including a plurality of pixel units is provided, wherein each of the plurality of pixel units includes: a substrate; a control circuit layer arranged on the substrate; an intermediate layer arranged on a side of the control circuit layer away from the substrate; a first electrode layer, a first light-emitting layer, a second electrode layer, a second light-emitting layer, a third electrode layer, a third light-emitting layer and a fourth electrode layer sequentially stacked on the intermediate layer, wherein the first light-emitting layer, the second light-emitting layer and the third light-emitting layer are used as a first light-emitting element, a second light-emitting element and a third light-emitting element, respectively.

In some embodiments, the substrate includes a first area and a second area that do not overlap each other; and projections of at least a part of the first electrode layer, the first light-emitting layer, at least a part of the second electrode layer, the second light-emitting layer, at least a part of the third electrode layer, the third light-emitting layer and at least a part of the fourth electrode layer on the substrate are located in the second area.

In some embodiments, each of the first electrode layer, the second electrode layer and the third electrode layer is electrically coupled to the control circuit layer through a through hole penetrating the intermediate layer.

In some embodiments, the first electrode layer comprises an opaque material, and the second electrode layer, the third electrode layer and the fourth electrode layer each comprises a transparent material.

BRIEF DESCRIPTION OF THE DRAWINGS

In order to more clearly illustrate the technical solutions in the embodiments of the present disclosure or in the related art, the accompanying drawings required in the description of the embodiments are briefly introduced below. Obviously, the accompanying drawings in the following description are some embodiments of the present disclosure. For those ordinary skilled in the art, other accompanying drawings may be obtained from these accompanying drawings without carrying out any inventive effort.

FIG. 9 shows a schematic block diagram of a display panel according to the embodiments of the present disclosure.

FIG. 10 shows a flowchart of a method for driving a pixel circuit according to the embodiments of the present disclosure.

DETAILED DESCRIPTION OF EMBODIMENTS

Figure 1:
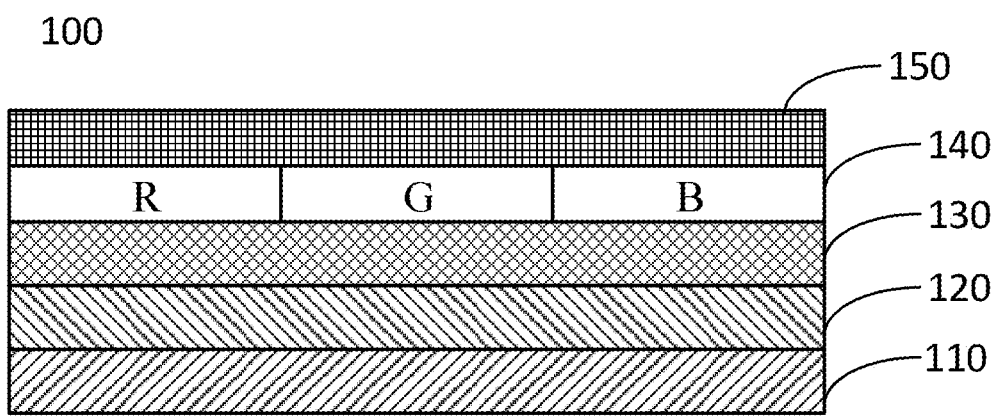
FIG. 1 shows a schematic cross-sectional view of a pixel unit of a display panel according to the related art.

In order to make the objectives, technical solutions and advantages of the present disclosure more clear, the technical solutions of the present disclosure are clearly and completely described below with reference to the accompanying drawings of the embodiments of the present disclosure. Obviously, the described embodiments are only a part but not all of the embodiments of the present disclosure. Based on the described embodiments of the present disclosure, all other embodiments obtained by those ordinary skilled in the art without carrying out inventive effort fall within the protection scope of the present disclosure. It should be noted that throughout the accompanying drawings, the same elements are represented by the same or similar reference signs. In the following description, some specific embodiments are only used for descriptive purposes, and should not be construed as limiting the present disclosure. They are merely examples of the embodiments of the present disclosure. When it may cause confusion in the understanding of the present disclosure, conventional structures or configurations will be omitted. It should be noted that the shape and size of each component in the figure do not reflect the actual size and ratio, but merely illustrate the content of the embodiments of the present disclosure.

Unless otherwise defined, the technical or scientific terms used in the embodiments of the present disclosure should have the usual meanings understood by those skilled in the art. The words "first," "second," and the like used in the embodiments of the present disclosure do not indicate any order, quantity or importance, but are only used to distinguish different composition parts.

In addition, in the description of the embodiments of the present disclosure, the term "electrically coupled" may mean that two components are electrically coupled directly, or that two components are electrically coupled via one or more other components. In addition, these two components may be electrically coupled or coupled by wired or wireless means.

In the following embodiments, the specific type of display is not limited, but those skilled in the art should understand that any display that emits light by providing a light-emitting layer and applying a voltage across the light-emitting layer (for example, OLED display, quantum dot light-emitting diode (QLED) display) is covered by the present disclosure.

Transistors used in the embodiments of the present disclosure may all be thin film transistors (TFT) or field effect transistors or other devices with the same characteristics. According to the functions in the circuit, the transistors used in the embodiments of the present disclosure are mainly switching transistors. Since source and drain electrodes of the thin film transistor used here are symmetrical, the source and drain electrodes may be interchanged. In the embodiments of the present disclosure, one of the source electrode and the drain electrode is called a first electrode, and the other is called a second electrode. In the following examples, the driving transistor is described as a P-type thin film transistor, and other transistors are of the same or different type as the driving transistor according to circuit designs. Similarly, in other embodiments, the driving transistor may also be shown as an N-type thin film transistor. Those skilled in the art may understand that by correspondingly changing the types of other transistors and inverting the driving signals and level signals (and/or making other additional adaptive modifications), the technical solutions of the present disclosure may also be implemented.

In addition, in the description of the embodiments of the present disclosure, the terms "first level" and "second level" are only used to distinguish an amplitude difference between the two levels. In some embodiments, the "first level" may be an invalid level that turns off the relevant transistor, and the "second level" may be a valid level that turns on the relevant transistor. Hereinafter, since the driving transistor is exemplified as a P-type thin film transistor, the "first level" is exemplified as a high level, and the "second level" is exemplified as a low level.

The present disclosure will be described in detail below with reference to the accompanying drawings.

FIG. 1 shows a schematic cross-sectional view of a pixel unit 100 of a display panel according to the related art.

The display panel includes a plurality of pixel units 100. As shown in FIG. 1, the pixel unit 100 includes a substrate 110, a control circuit layer 120, a first electrode layer 130, a light-emitting layer 140, and a second electrode layer 150.

The substrate 110 may be, for example, a glass substrate.

Pixel circuits are formed in the control circuit layer 120. For example, the control circuit layer 120 may include a plurality of pixel circuits configured to control different light-emitting elements (sub-pixels).

The first electrode layer 130 is arranged on a side of the control circuit layer 120 away from the substrate 110. The first electrode layer 130 may include a plurality of driving electrodes coupled to different pixel circuits in the control circuit layer 120, respectively, so as to receive, from the respective pixel circuits, driving voltages for driving different light-emitting elements in the light-emitting layer 140. A part of the first electrode layer 130 is arranged in a light-emitting area in the pixel unit 100, and the first electrode layer 130 may include an opaque material (for example, Al and Ag).

In some embodiments, one or more intermediate layers may be further provided. The intermediate layer may be located between the control circuit layer 120 and the first electrode layer 130, or may surround the first electrode layer 130 outside the light-emitting area. The first electrode layer 130 is electrically coupled to the pixel circuit in the control circuit layer 120 through a through hole penetrating the one or more intermediate layers. The intermediate layer may include an interlayer dielectric layer (ILD) and various flat layers, insulating layers or organic layers.

The light-emitting layer 140 includes three portions arranged side by side. The three portions correspond to a red light-emitting element (R), a green light-emitting element (G) and a blue light-emitting element (B) in the pixel unit 100, respectively, so as to emit red, green and blue light. As described above, each light-emitting element corresponds to one pixel circuit in the control circuit layer 120 and one electrode in the first electrode layer 130, so as to receive a driving voltage from a corresponding pixel circuit through a corresponding electrode. The light-emitting layer 140 is used as the light-emitting elements in the pixel circuit.

The second electrode layer 150 may include a common electrode, and each light-emitting element of each pixel unit on the panel may share a same electrode. The common electrode may be a transparent electrode (for example, may be made of indium tin oxide (ITO)).

In the pixel structure of FIG. 1, light-emitting elements of different colors are arranged laterally on the panel, which occupy a large space of the panel and are not conducive to the realization of high PPI.

Figure 2A:
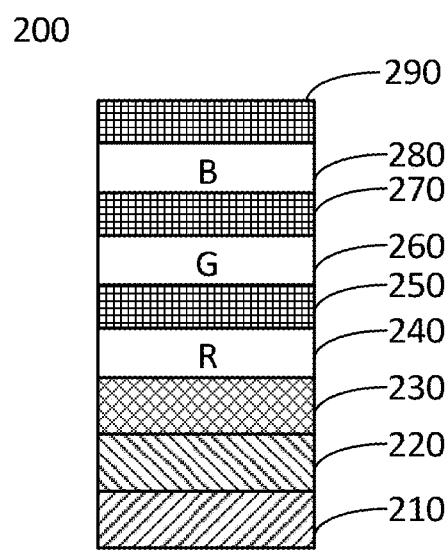
FIG. 2A shows a schematic cross-sectional view of a pixel unit of a display panel according to the embodiments of the present disclosure.

FIG. 2A shows a schematic cross-sectional view of a pixel unit 200 of a display panel according to the embodiments of the present disclosure.

As shown in FIG. 2A, the pixel unit 200 includes a substrate 210, a control circuit layer 220, a first electrode layer 230, a first light-emitting layer 240, a second electrode layer 250, a second light-emitting layer 260, a third electrode layer 270, a third light-emitting layer 280 and a fourth electrode layer 290.

The substrate 210 may be, for example, a glass substrate.

Pixel circuits are formed in the control circuit layer 220. For example, a single pixel circuit may be formed in the control circuit layer 220. The single pixel circuit is configured to control the light-emitting layers in the pixel unit 200 to emit light in different periods.

The first electrode layer 230 is arranged on a side of the control circuit layer 220 away from the substrate 210. The first electrode layer 230 may include a single driving electrode, which is electrically coupled to the pixel circuit in the control circuit layer 220, so as to receive a driving voltage for driving the first light-emitting layer 240 from the pixel circuit in a first period of a frame time. A part of the first electrode layer 230 is arranged in a light-emitting area of the pixel unit 200, and the driving electrode may include an opaque material (for example, Al and Ag).

Figure 2B:
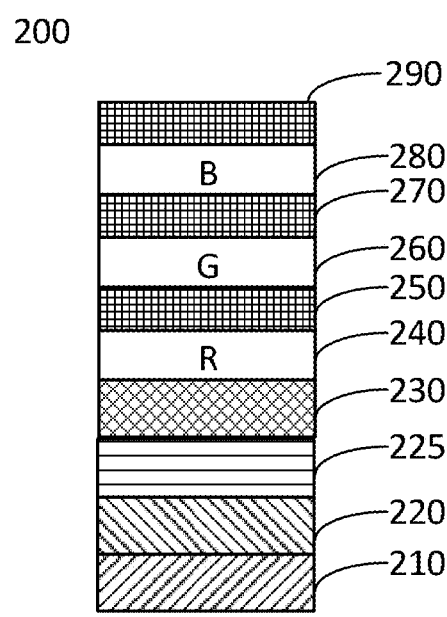
FIG. 2B shows a schematic cross-sectional view of another pixel unit of a display panel according to the embodiments of the present disclosure.

In some embodiments, as shown in FIG. 2B, one or more intermediate layers 225 may be further provided. The intermediate layer 225 may be provided between the control circuit layer 220 and the first electrode layer 230, or may surround the first electrode layer 230 and a layer structure thereon outside the light-emitting area. The first electrode layer 230 is electrically coupled to the pixel circuit in the control circuit layer 220 through a through hole penetrating the intermediate layer. The intermediate layer may include an interlayer dielectric layer (ILD) and various flat layers, insulating layers or organic layers.

The first light-emitting layer 240 includes a single portion corresponding to a red light-emitting element (R) in the pixel unit 200 to emit red light. The first light-emitting layer 240 receives a driving voltage from the pixel circuit in the control circuit layer 220 through a driving electrode in the first electrode layer 230.

The second electrode layer 250 is arranged on a side of the first light-emitting layer 240 away from the substrate 210. The second electrode layer 250 may include a single electrode, which is electrically coupled to the pixel circuit in the control circuit layer 220, so as to receive a common voltage in the first period of a frame time, and to receive, from the pixel circuit, a driving voltage for driving the second light-emitting layer 260 to emit light in the second period of a frame time. The driving electrode in the second electrode layer 250 may be a transparent electrode. In order to achieve electrical coupling between the second electrode layer 250 and the pixel circuit in the control circuit layer 220, a through hole is provided in the intermediate layer.

The second light-emitting layer 260 includes a single portion corresponding to a green light-emitting element (G) in the pixel unit 200 to emit green light. The second light-emitting layer 260 receives a driving voltage from the pixel circuit in the control circuit layer 220 through a driving electrode in the second electrode layer 250.

The third electrode layer 270 is arranged on a side of the second light-emitting layer 260 away from the substrate 210. The third electrode layer 270 may include a single electrode, which is electrically coupled to the pixel circuit in the control circuit layer 220, so as to receive the common voltage in the second period of a frame time, and to receive, from the pixel circuit, the driving voltage for driving the third light-emitting layer 280 to emit light in the third period of a frame time. The driving electrode in the third electrode layer 270 may be a transparent electrode. In order to achieve electrical coupling between the third electrode layer 270 and the pixel circuit in the control circuit layer 220, a through hole is provided in the intermediate layer.

The third light-emitting layer 280 includes a single portion corresponding to the blue light-emitting element (G) in the pixel unit 200 to emit blue light. The third light-emitting layer 280 receives a driving voltage from the pixel circuit in the control circuit layer 220 through a driving electrode in the third electrode layer 270.

The fourth electrode layer 290 is arranged on a side of the third light-emitting layer 280 away from the substrate 210. The fourth electrode layer 290 may include a single electrode, which is electrically coupled to the pixel circuit in the control circuit layer 220 to receive the common voltage in a third period of a frame time. The driving electrode in the fourth electrode layer 290 may be a transparent electrode. In order to achieve electrical coupling between the fourth electrode layer 290 and the pixel circuit in the control circuit layer 220, a through hole is provided in the intermediate layer.

Figure 3:
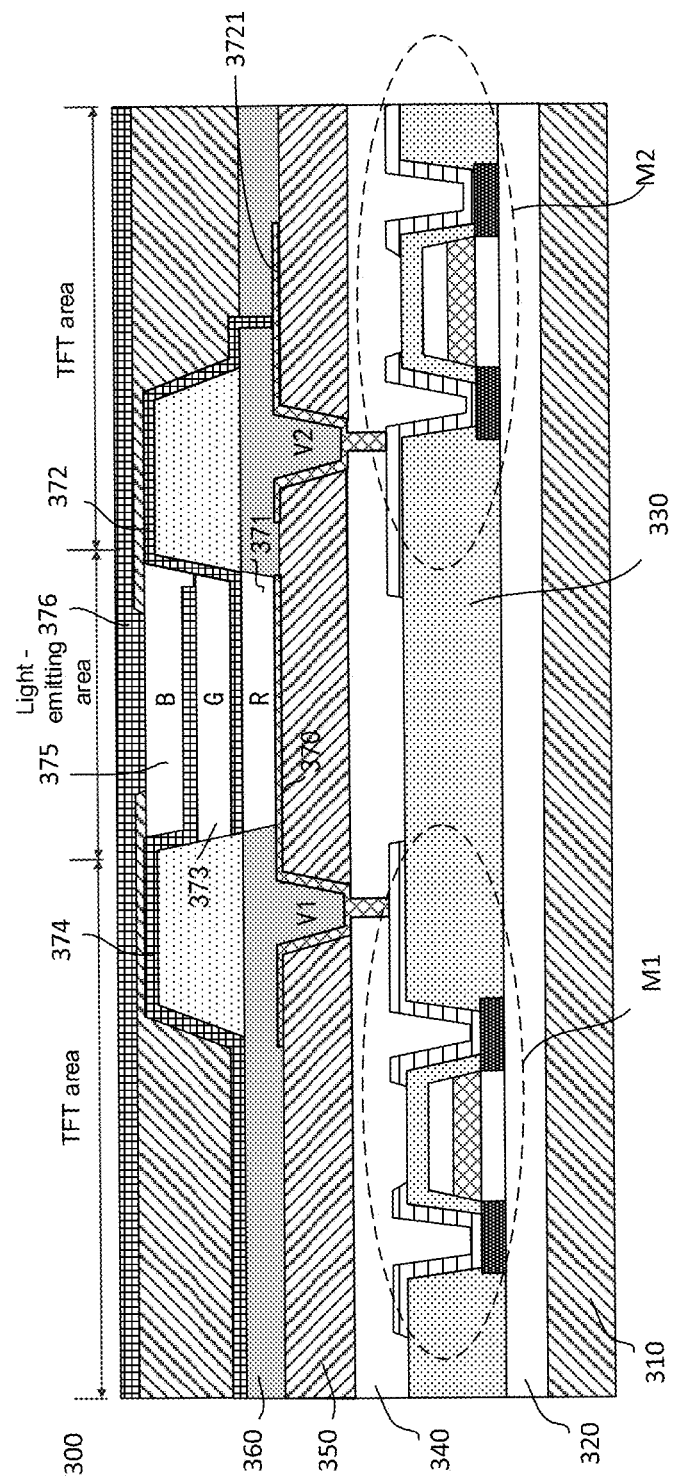
FIG. 3 shows a more detailed layer-structure diagram of a pixel unit according to the embodiments of the present disclosure.

FIG. 3 shows a more detailed layer-structure diagram of a pixel unit according to the embodiments of the present disclosure.

As shown in FIG. 3, the pixel unit 300 includes a substrate 310, a buffer layer 320, a control circuit layer 330, a first intermediate layer 340, a second intermediate layer 350, a third intermediate layer 360, a first electrode layer 370, a first light-emitting layer 371, a second electrode layer 372, a second light-emitting layer 373, a third electrode layer 374, a third light-emitting layer 375, and a fourth electrode layer 376 stacked in sequence. The first light-emitting layer 371, the second light-emitting layer 373 and the third light-emitting layer 375 are located in the light-emitting area of the pixel unit. Parts of the first electrode layer 370, the second electrode layer 372, the third electrode layer 374 and the fourth electrode layer 376 are located in the light-emitting area, and the other parts of the first electrode layer 370, the second electrode layer 372, the third electrode layer 374 and the fourth electrode layer 376 are located in a TFT area, so as to facilitate electrical coupling to the pixel circuit or a common power line. It should be understood that in other embodiments, some layers (for example, the buffer layer 320) in the structure shown in FIG. 3 may be removed or new layers may be added, and structures of some layers may be changed, which is not limited in the present disclosure.

Exemplarily, the substrate 310 in FIG. 3 includes a TFT area (a first area) and a light-emitting area (a second area) that do not overlap each other.

Exemplarily, the first intermediate layer 340 and the second intermediate layer 350 in FIG. 3 are arranged between the control circuit layer 330 and the first electrode layer 370, and the third intermediate layer 360 surrounds the first electrode layer 370 outside the light-emitting area.

Exemplarily, the control circuit layer 330 in FIG. 3 includes two transistors M1 and M2 in the pixel circuit. One of source electrode and drain electrode of the transistor M1 is electrically coupled to the first electrode layer 370 through a through hole V1, and a portion of the first electrode layer 370 is formed in the through hole V1. The transistor M2 is electrically coupled to the second electrode layer 372 through a through hole V2, and the second electrode layer 372 is electrically coupled to an electrical coupling layer 3721 provided in the through hole V2. The electrical coupling layer 3721 is arranged in a same layer as the first electrode layer 370 and is made of a material different from that of the second electrode layer 372. The third electrode layer 374 is also electrically coupled to a transistor in the pixel circuit. FIG. 3 takes a part of a specific cross-sectional view of the pixel unit, and the transistor coupled to the third electrode layer 374 is not shown.

As shown in the schematic diagrams of FIGS. 2A-2B and the schematic layer structure diagram of FIG. 3, by sequentially stacking three light-emitting elements in a vertical direction in an area where a single light-emitting element is originally provided, and by driving the three light-emitting elements separately by using the pixel circuit originally used to drive the single light-emitting element, a space of the panel occupied by each pixel unit is saved, which is more conducive to the realization of high PPI.

In order to realize a normal display of the display panel, it is necessary to design the pixel circuit and the signal timing so that the three light-emitting elements emit light in different periods, and each light-emitting element may not be affected by the driving of the other light-emitting elements.

Figure 4:
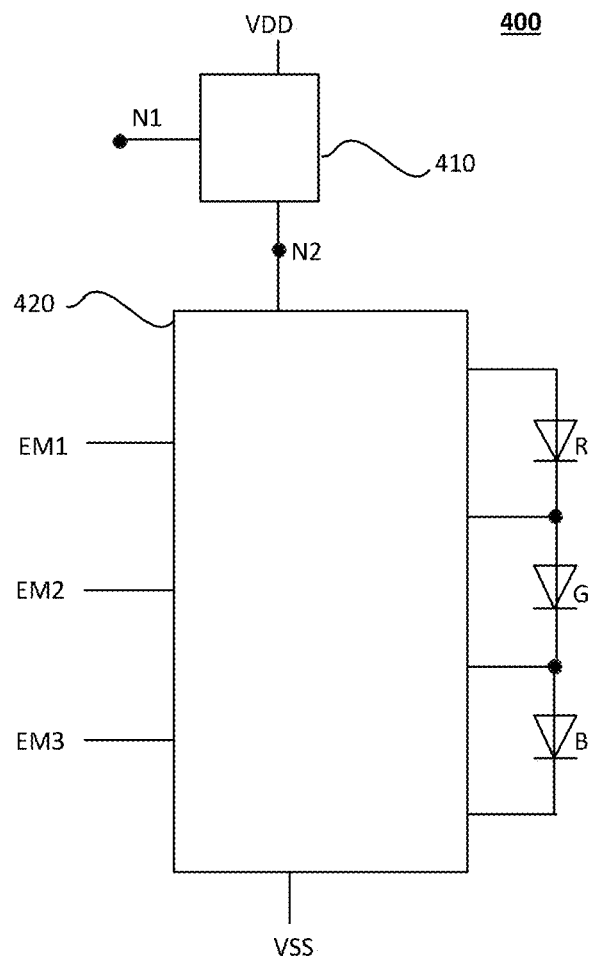
FIG. 4 shows a circuit structure diagram of a pixel circuit in a pixel unit according to the embodiments of the present disclosure.

FIG. 4 shows a circuit structure diagram of a pixel circuit 400 in a pixel unit according to the embodiments of the present disclosure.

As shown in FIG. 4, the pixel circuit 400 includes a driving sub-circuit 410, a light-emitting control sub-circuit 420, a first light-emitting element R, a second light-emitting element G, and a third light-emitting element B.

The driving sub-circuit 410 is electrically coupled to a first node N1, a first power signal terminal VDD and a second node N2. The driving sub-circuit 410 is configured to transmit a first power voltage at the first power signal terminal VDD to the second node N2 under control of a voltage at the first node N1.

The light-emitting control sub-circuit 420 is electrically coupled to the second node N2, a second power signal terminal VSS, a first light-emitting control terminal EM1, a second light-emitting control terminal EM2, a third light-emitting control terminal EM3, a first electrode of the first light-emitting element R, a second electrode of the first light-emitting element R, a first electrode of the second light-emitting element G, a second electrode of the second light-emitting element G, and a first electrode of the third light-emitting element B, and a second electrode of the third light-emitting element B. The light-emitting control sub-circuit 420 is configured to: transmit a voltage at the second node N2 and a second power voltage at the second power signal terminal VSS to the first electrode and the second electrode of the first light-emitting element R respectively in a first period, to the first electrode and the second electrode of the second light-emitting element G respectively in the second period, and to the first electrode and the second electrode of the third light-emitting element B respectively in the third period, under control of a first light-emitting control signal from the first light-emitting control terminal EM1, a second light-emitting control signal from the second light-emitting control terminal EM2, and a third light-emitting control signal from the third light-emitting control terminal EM3.

In this way, the circuit structure in FIG. 4 may achieve a time-sharing driving of three different light-emitting elements R, G and B in different periods of a frame time, so that the pixel unit in FIGS. 2A, 2B and 3 may display.

Figure 5:
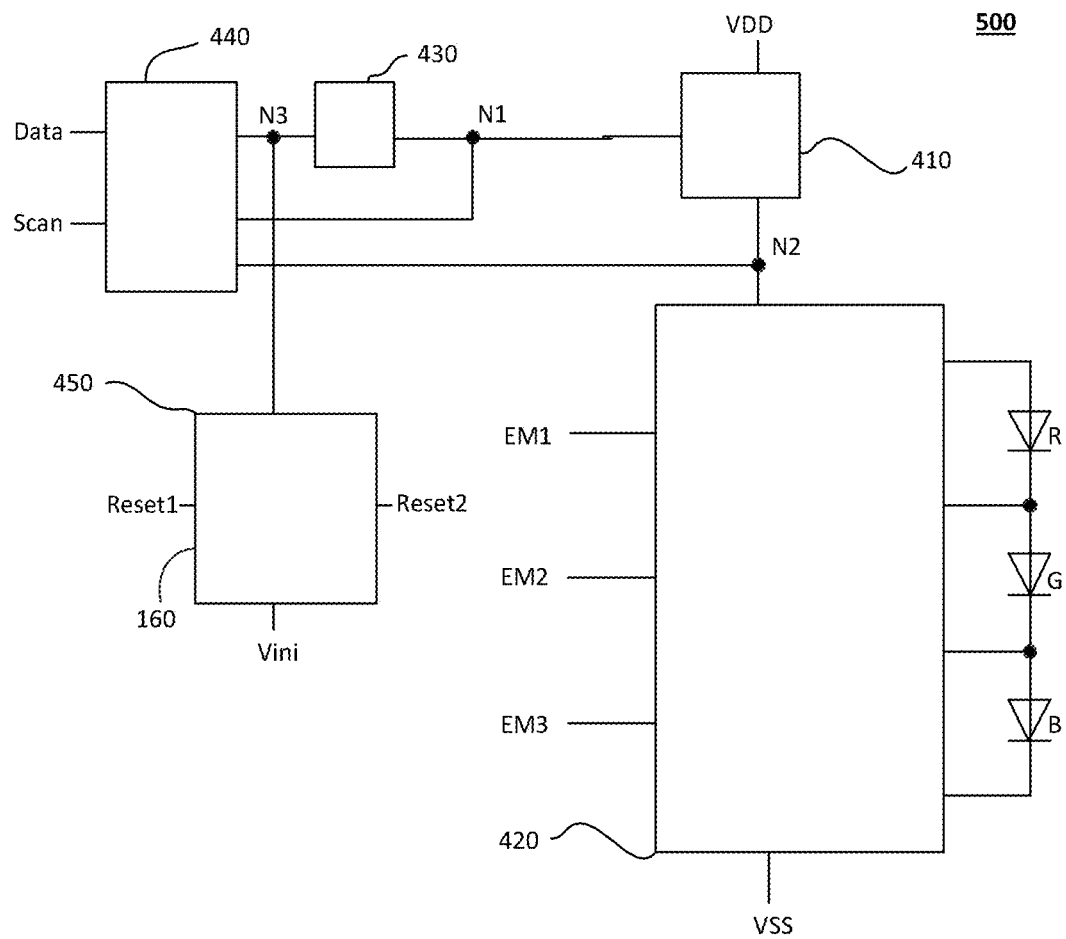
FIG. 5 shows a further circuit structure diagram of the pixel circuit in FIG. 4.

FIG. 5 shows a further circuit structure diagram of the pixel circuit in FIG. 4.

On the basis of FIG. 4, a pixel circuit 500 in FIG. 5 further includes a storage sub-circuit 430, a charging control sub-circuit 440 and a reset sub-circuit 450.

The storage sub-circuit 430 is electrically coupled between the first node N1 and the third node N3.

The charging control sub-circuit 440 is electrically coupled to a scan signal terminal Scan, a data signal terminal Data, the first node N1, the second node N2 and the third node N3, and is configured to generate a voltage difference between the first node N1 and the third node N3 under control a first scan voltage from the scan signal terminal Scan.

The reset sub-circuit 450 is electrically coupled to a first reset control terminal Reset1, a second reset control terminal Reset2, the third node N3 and a reset voltage signal terminal Vini, and is configured to reset the third node N3 by using a reset voltage signal from the reset voltage signal terminal Vini, under control of a first reset control signal from the first reset control terminal Reset1 or a second reset control signal from the second reset control terminal Reset2.

Figure 6:
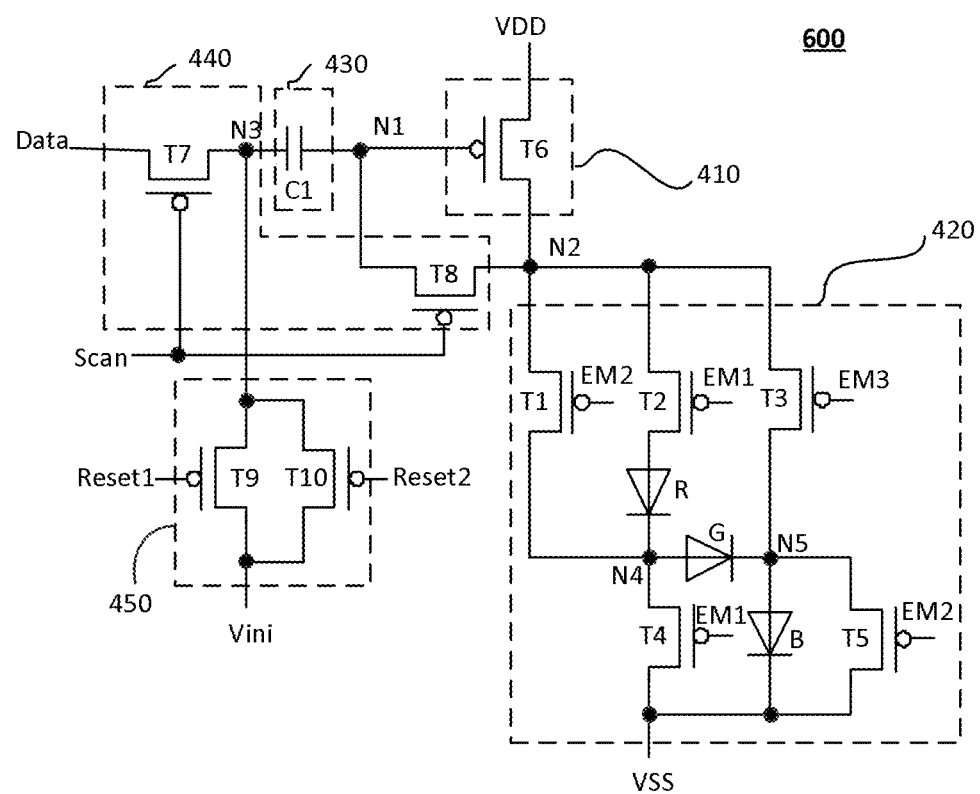
FIG. 6 shows a detailed circuit diagram of the pixel circuit shown in FIG. 5.

FIG. 6 shows a detailed circuit diagram of the pixel circuit shown in FIG. 5.

As shown in FIG. 6, the light-emitting control sub-circuit 420 may include a first transistor T1, a second transistor T2, a third transistor T3, a fourth transistor T4, and a fifth transistor T5.

The first transistor T1 has a control electrode electrically coupled to the second light-emitting control terminal EM2, a first electrode electrically coupled to the second node N2, and a second electrode electrically coupled to a fourth node N4.

The second transistor T2 has a control electrode electrically coupled to the first light-emitting control terminal EM1, a first electrode electrically coupled to the second node N2, and a second electrode electrically coupled to the first electrode of the first light-emitting element R.

The third transistor T3 has a control electrode electrically coupled to the third light-emitting control terminal EM3, a first electrode electrically coupled to the second node N2, and a second electrode electrically coupled to a fifth node N5.

The fourth transistor T4 has a control electrode electrically coupled to the first light-emitting control terminal EM1, a first electrode electrically coupled to the fourth node N4, and a second electrode electrically coupled to a second power signal terminal VSS.

The fifth transistor T5 has a control electrode electrically coupled to the second light-emitting control terminal EM2, a first electrode electrically coupled to the fifth node N5, and a second electrode electrically coupled to the second power signal terminal VSS.

The second electrode of the first light-emitting element R is electrically coupled to the first electrode of the second light-emitting element G via the fourth node N4, the second electrode of the second light-emitting element G is electrically coupled to the first electrode of the third light-emitting element B via the fifth node N5, and the second electrode of the third light-emitting element B is electrically coupled to the second power signal terminal VSS.

The driving sub-circuit 410 includes a sixth transistor T6.

The sixth transistor T6 has a control electrode electrically coupled to the first node N1, a first electrode electrically coupled to the first power signal terminal VDD, and a second electrode electrically coupled to the second node N2.

The storage sub-circuit 430 includes a first capacitor C1.

The first capacitor C1 has first terminal electrically coupled to the third node N3, and a second terminal electrically coupled to the first node N1.

The charging control sub-circuit 440 includes a seventh transistor T7 and an eighth transistor T8.

The seventh transistor T7 has a control electrode electrically coupled to the scan signal terminal Scan, a first electrode electrically coupled to the data signal terminal Data, and a second electrode electrically coupled to the third node N3.

The eighth transistor T8 has a control electrode electrically coupled to the scan signal terminal Scan, a first electrode electrically coupled to the first node N1, and a second electrode electrically coupled to the second node N2.

The reset sub-circuit 450 includes a ninth transistor T9 and a tenth transistor T10.

The ninth transistor T9 has a control electrode electrically coupled to the first reset control terminal Reset1, a first electrode electrically coupled to the reset voltage signal terminal Vini, and a second electrode electrically coupled to the third node N3.

The tenth transistor T10 has a control electrode electrically coupled to the second reset control terminal Reset2, a first electrode electrically coupled to the reset voltage signal terminal Vini, and a second electrode electrically coupled to the third node N3.

In some embodiments, the scan signal terminal Scan is configured to receive a scan signal for a current row of pixels, the first reset control terminal Reset1 is configured to receive a scan signal for a previous row of pixels, and the second reset control terminal Reset2 is configured to receive a scan signal for a next row of pixels. In the following description, this case is illustrated by way of example.

Figure 7A:
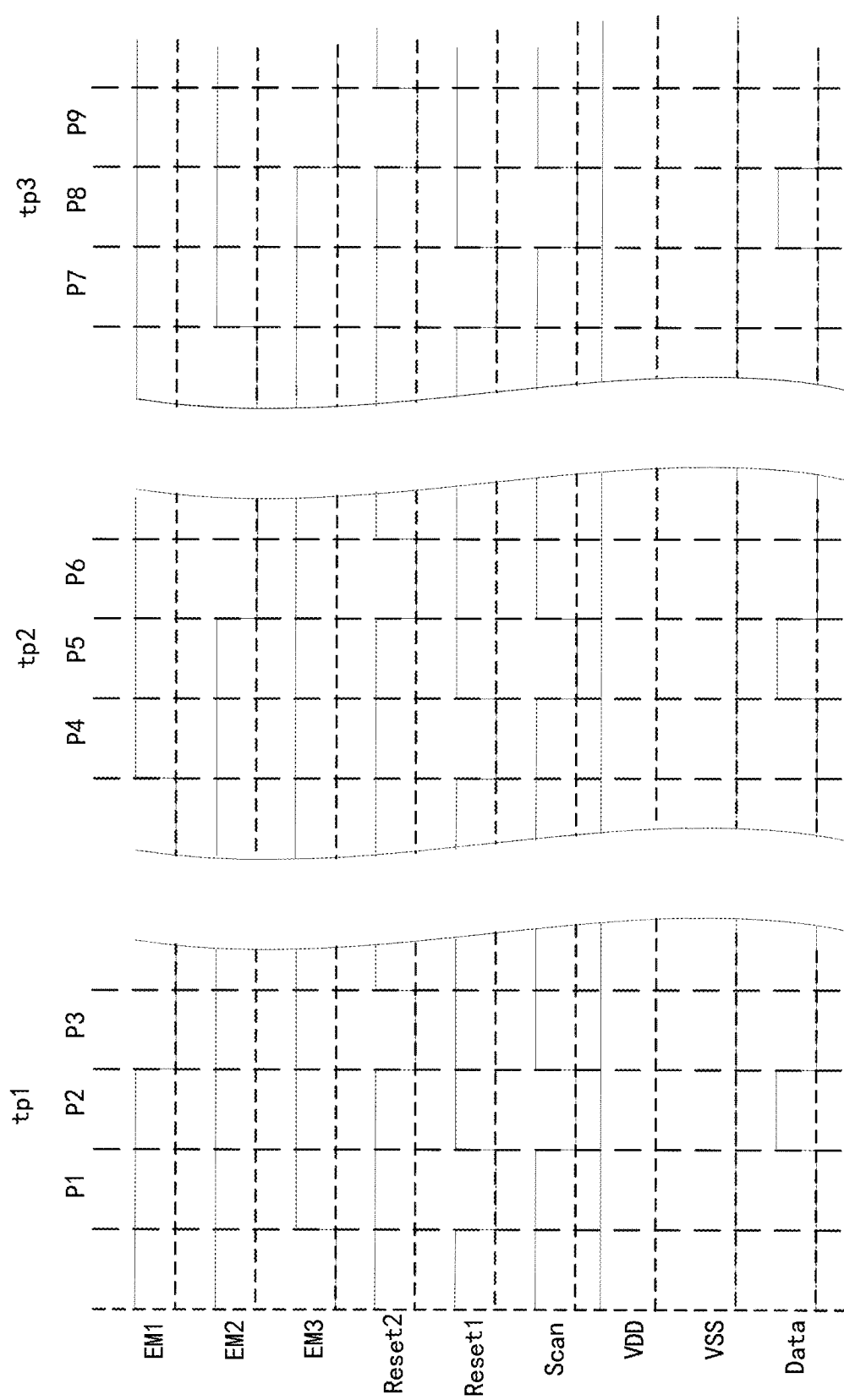
FIG. 7A shows a signal timing diagram of the pixel circuit shown in FIG. 6.

FIG. 7A shows a signal timing diagram of the pixel circuit shown in FIG. 6. FIGS. 7B-7F show schematic diagrams of the principle of each phase in the pixel circuit shown in FIG. 6.

For example, referring to FIG. 7A, each frame time includes three periods tp1, tp2 and tp3. In each period, one light-emitting element (that is, one sub-pixel) is driven to emit light. For example, the first light-emitting element R is driven in the period tp1, the second light-emitting element G is driven in the period tp2, and the third light-emitting element B is driven in the period tp3. Each period is divided into three phases, that is, an initialization phase, a charging phase and a light-emitting phase.

Firstly described is the first period tp1, in which the first light-emitting element R is driven to emit light.

In an initialization phase P1, the first light-emitting control terminal EM1, the second light-emitting control terminal EM2 and the third light-emitting control terminal EM3 each provide a signal being at a high level, so that all of T1 to T5 are turned off.

The first reset control terminal Reset1 provides a signal being at a low level, and the second reset control terminal Reset2 and the scan signal terminal Scan each provide a signal being at a high level. Thus, T7, T8 and T10 are turned off, and T9 is turned on. The third node N3 is reset by Vini. Assuming that a voltage at the Vini is VGL, the third node N3 is reset to the VGL. Moreover, due to the function of the capacitor C1, the voltage at the third node N3 changes a floating voltage at the first node N1 to be the VGL, so that T6 is turned on, and a voltage Vdd at the first power terminal VDD is transmitted to the second node N2.

Figure 7B:
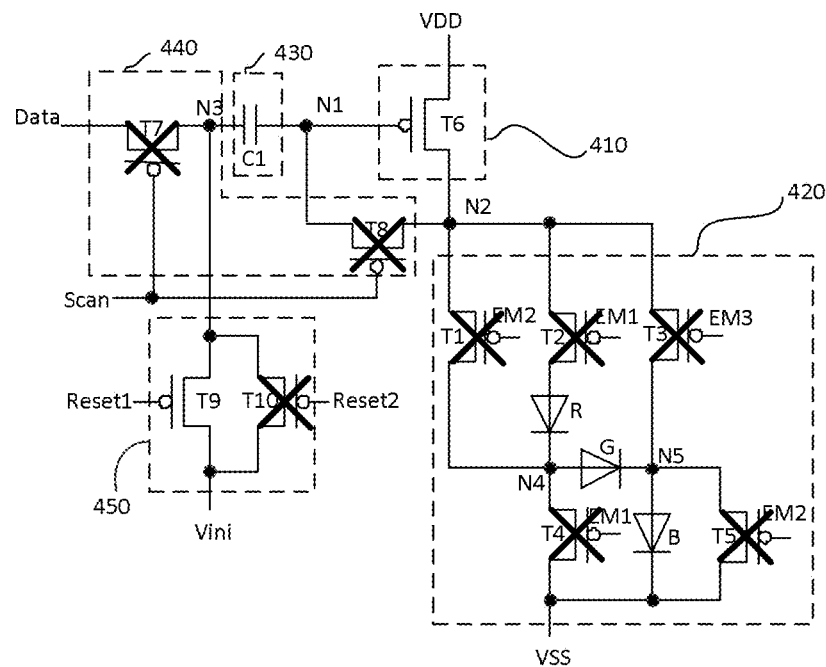
FIGS. 7B-7F show schematic diagrams of the principle in each phase in the pixel circuit shown in FIG. 6.

In the initialization phase P1, the schematic diagram of the principle of the pixel circuit is shown in FIG. 7B. It should be noted that in FIG. 7B, each of the transistors that are turned off in this phase is marked with an oblique cross "x".

In a charging phase P2, the first light-emitting control terminal EM1, the second light-emitting control terminal EM2 and the third light-emitting control terminal EM3 each keep providing a signal being at a high level, so that T1 to T5 remain off.

The scan signal terminal Scan provides a signal being at a low level, and the first reset control terminal Reset1 and the second reset control terminal Reset2 each provide a signal being at a high level. Thus, T7 and T8 are turned on, and T9 and T10 are turned off. Then, a data voltage Vdata being at a high level is input to the third node N3 from the data signal terminal Data, and a level at the first terminal of the first capacitor C1 becomes Vdata. On the other hand, the first node N1 and the second node N2 are electrically coupled, and the first power signal terminal VDD starts to charge the first node, a balance is reached until a level at the node N1 becomes Vdd+Vth, and Vth is a threshold voltage of the sixth transistor T6.

In this phase, through the charging of the data voltage terminal Data and the first power terminal VDD, a voltage applied to one terminal of the first capacitor C1 is different from a voltage applied to another terminal of the first capacitor C1, and a voltage difference Vdd+Vth-Vdata is generated.

Figure 7C:
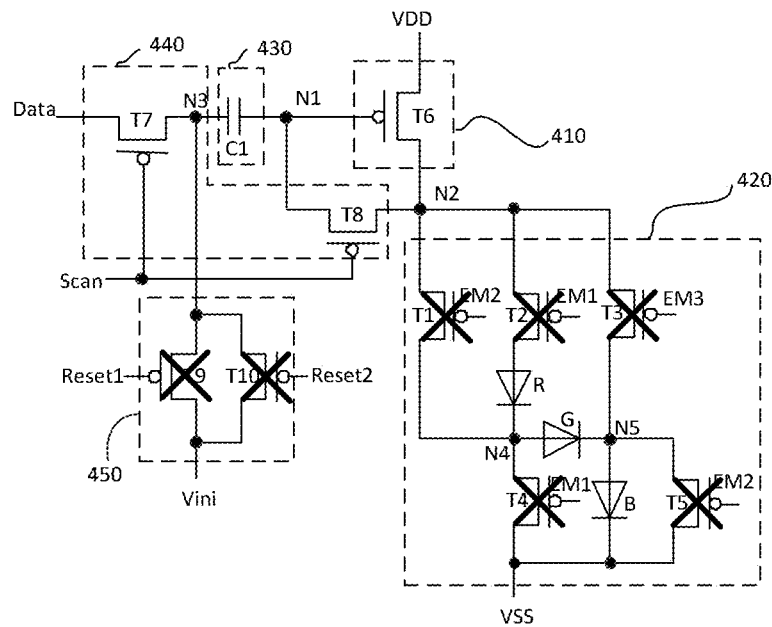

In the charging phase P2, the schematic diagram of the principle of the pixel circuit is shown in FIG. 7C. It should be noted that in FIG. 7C, each of the transistors that are turned off in this phase is marked with an oblique cross "x".

In a light-emitting phase P3, the second light-emitting control terminal EM2 and the third light-emitting control terminal EM3 each keep providing a signal being at a high level, and the first light-emitting control terminal EM1 provides a signal being at a low level, so that T1, T3 and T5 remain off, and T2 and T4 are turned on, which makes both terminals of the first light-emitting element R coupled to the second node N2 and the second power terminal VSS, respectively.

The scan signal terminal Scan and the first reset control terminal Reset1 each provides a signal being at a high level, and the second reset control terminal Reset2 provides a signal being at a low level. Thus, T10 is turned on, and T7 to T9 are turned off. Then, the reset signal terminal *Vini* changes the voltage at the third node N3 to the VGL. Since the first node N1 becomes floating again, the first capacitor C1 maintains the previously generated voltage difference. Thus, the voltage at the first node N1 becomes Vdd+Vth−Vdata+VGL. At this time, the sixth transistor T6 is in a saturated state. For the P-type transistor T6, a source-gate voltage Vsg of the transistor T6 is:

$$Vsg=Vdd-(Vdd+Vth-V\text{data}+VGL)=V\text{data}-VGL-Vth.$$

Therefore, the expression of the driving current Id is:

$$Id=K\cdot(Vgs-Vth)^2$$

$$=K\cdot(-V\text{data}+VGL+Vth-Vth)^2$$

$$=K\cdot(V\text{data}-VGL)^2$$

where K is a current constant associated with the sixth transistor T6, and is related to process parameters and geometric dimensions of the sixth transistor T6. According to the above equation, the driving current Id used to drive the first light-emitting element R to emit light has nothing to do with the threshold voltage Vth of the sixth transistor T6, thereby eliminating brightness unevenness of the light-emitting element caused by the difference in the threshold voltage Vth of the sixth transistor T6.

Figure 7D:
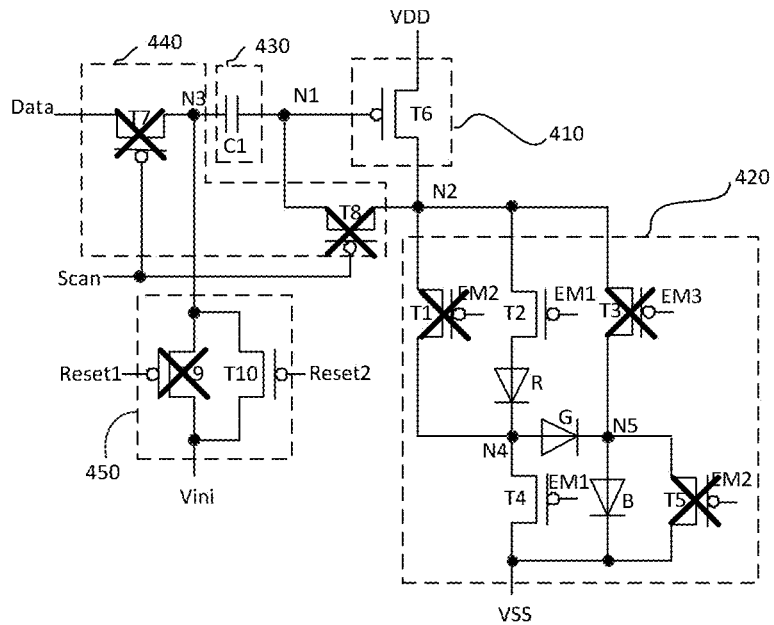

In the light-emitting phase P3, the schematic diagram of the principle of the pixel circuit is shown in FIG. 7D. It should be noted that in FIG. 7D, each of the transistors that are turned off in this phase is marked with an oblique cross "x".

Next described is the second period tp2, in which the second light-emitting element G is driven to emit light.

According to the timing diagram of FIG. 7A, operations in an initialization phase P4 and a charging phase P5 of the second period tp2 are exactly the same as the operations in the initialization phase P1 and the charging phase P2 of the first period tp1, which will not be repeated here.

A difference between the second period tp2 and the first period tp1 lies in the light-emitting phase. In a light-emitting phase P6, the first light-emitting control terminal EM1 and the third light-emitting control terminal EM3 each keep providing a signal being at a high level, and the second light-emitting control terminal EM2 provides a signal being at a low level, so that T2, T3 and T4 are turned off, and T1 and T5 are turned on, which makes both terminals of the second light-emitting element G coupled to the second node N2 and the second power terminal VSS, respectively.

The scan signal terminal Scan and the first reset control terminal Reset1 each provides a signal being at a high level, and the second reset control terminal Reset2 provides a signal being at a low level. Thus, T10 is turned on, and T7 to T9 are turned off. Then, the reset signal terminal Vini changes the voltage at the third node N3 to the VGL. Since the first node N1 becomes floating again, the first capacitor C1 maintains the previously generated voltage difference. Thus, the voltage at the first node N1 becomes Vdd+Vth−Vdata+VGL. At this time, the sixth transistor T6 is in a saturated state. For the P-type transistor T6, a source-gate voltage Vsg of the transistor T6 is:

$$Vsg=Vdd-(Vdd+Vth-V\text{data}+VGL)=V\text{data}-VGL-Vth.$$

Therefore, the expression of the driving current Id is:

$$Id=K\cdot(Vgs-Vth)^2$$

$$=K\cdot(-V\text{data}+VGL+Vth-Vth)^2$$

$$=K\cdot(V\text{data}-VGL)^2$$

where K is a current constant associated with the sixth transistor T6, and is related to process parameters and geometric dimensions of the sixth transistor T6. According to the above equation, the driving current Id used to drive the second light-emitting element G to emit light has nothing to do with the threshold voltage Vth of the sixth transistor T6, thereby eliminating brightness unevenness of the light-emitting element caused by the difference in the threshold voltage Vth of the sixth transistor T6.

Figure 7E:
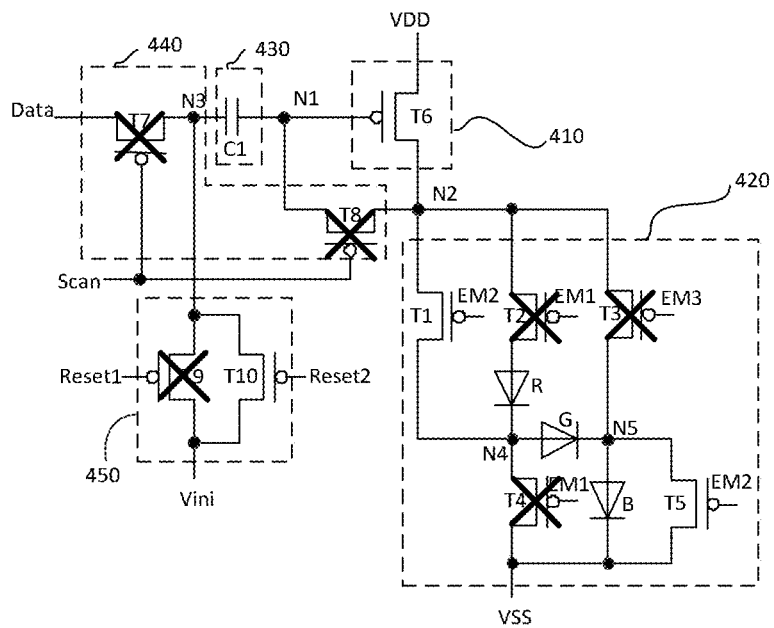

In the light-emitting phase P6, the schematic diagram of the principle of the pixel circuit is shown in FIG. 7E. It should be noted that in FIG. 7E, each of the transistors that are turned off in this phase is marked with an oblique cross "x".

Finally described is the third period tp3, in which the third light-emitting element B is driven to emit light.

According to the timing diagram of FIG. 7A, operations in an initialization phase P7 and a charging phase P8 of the third period tp3 are exactly the same as the operations in the initialization phase P1 and the charging phase P2 of the first period tp1, which will not be repeated here.

A difference between the third period tp3 and the first period tp1 lies in the light-emitting phase. In a light-emitting phase P9, the first light-emitting control terminal EM1 and the second light-emitting control terminal EM2 each keep providing a signal being at a high level, and the third light-emitting control terminal EM3 provides a signal being at a low level, so that T1, T2, T4 and T5 are turned off, and T3 is turned on, which makes both terminals of the third light-emitting element B coupled to the second node N2 and the second power terminal VSS, respectively.

The scan signal terminal Scan and the first reset control terminal Reset1 each provide a signal being at a high level, and the second reset control terminal Reset2 provides a signal being at a low level. Thus, T10 is turned on, and T7 to T9 are turned off. Then, the reset signal terminal Vini changes the voltage at the third node N3 to the VGL. Since the first node N1 becomes floating again, the first capacitor C1 maintains the previously generated voltage difference. Thus, the voltage at the first node N1 becomes Vdd+Vth−Vdata+VGL. At this time, the sixth transistor T6 is in a saturated state. For the P-type transistor T6, a source-gate voltage Vsg of the transistor T6 is:

$$Vsg=Vdd-(Vdd+Vth-V\text{data}+VGL)=V\text{data}-VGL-Vth.$$

Therefore, the expression of the driving current Id is:

$$Id=K\cdot(Vgs-Vth)^2$$

$$=K\cdot(-V\text{data}+VGL+Vth-Vth)^2$$

$$=K\cdot(V\text{data}-VGL)^2$$

where K is a current constant associated with the sixth transistor T6, and is related to process parameters and geometric dimensions of the sixth transistor T6. According to the above equation, the driving current Id used to drive the third light-emitting element B to emit light has nothing to do with the threshold voltage Vth of the sixth transistor T6, thereby eliminating brightness unevenness of the light-emitting element caused by the difference in the threshold voltage Vth of the sixth transistor T6.

Figure 7F:
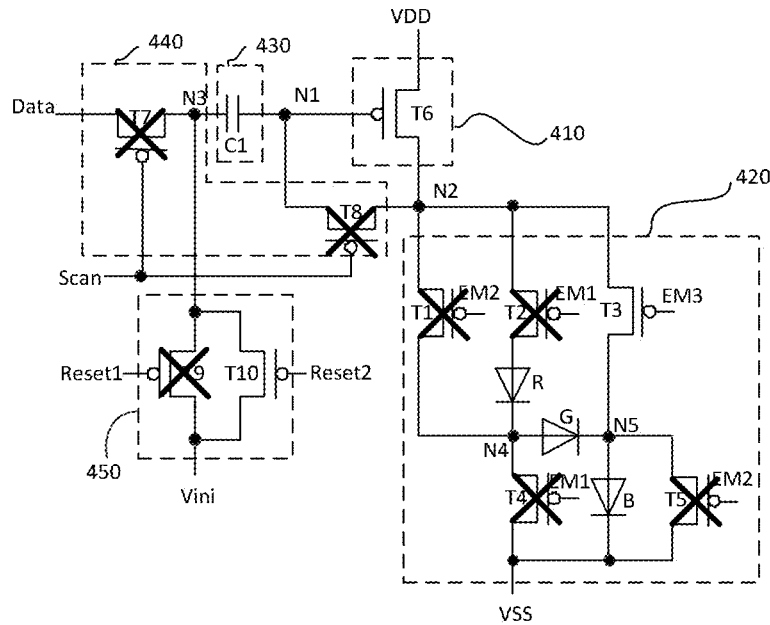

In the light-emitting phase P9, the schematic diagram of the principle of the pixel circuit is shown in FIG. 7F. It should be noted that in FIG. 7F, each of the transistors that are turned off in this phase is marked with an oblique cross "x".

Figure 8:
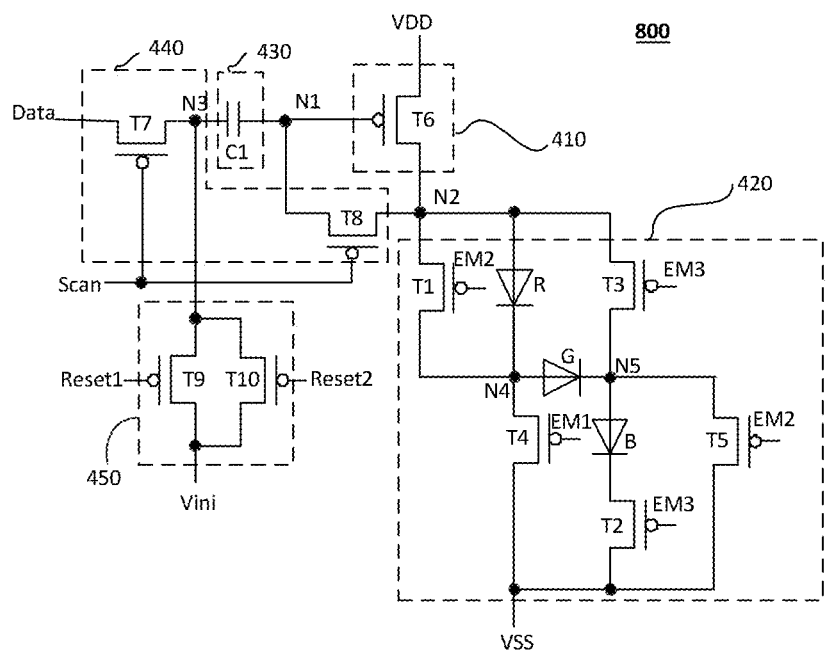
FIG. 8 shows another detailed circuit diagram of the pixel circuit shown in FIG. 5.

FIG. 8 shows another detailed circuit diagram of the pixel circuit shown in FIG. 5. A pixel circuit 800 in FIG. 8 differs from the pixel circuit 600 in FIG. 6 in the circuit structure of the light-emitting control sub-circuit 420. The circuit structure of the other sub-circuits may not be repeated here.

As shown in FIG. 8, the light-emitting control sub-circuit 420 may include a first transistor T1, a second transistor T2, a third transistor T3, a fourth transistor T4 and a fifth transistor T5.

The first transistor T1 has a control electrode electrically coupled to the second light-emitting control terminal EM2, a first electrode electrically coupled to the second node N2, and a second electrode electrically coupled to a fourth node N4.

The second transistor T2 has a control electrode electrically coupled to the third light-emitting control terminal EM3, a first electrode electrically coupled to the second electrode of the third light-emitting element B, and a second electrode electrically coupled to the second power signal terminal VSS.

The third transistor T3 has a control electrode electrically coupled to the third light-emitting control terminal EM3, a first electrode electrically coupled to the second node N2, and a second electrode electrically coupled to the fifth node N5.

The fourth transistor T4 has a control electrode electrically coupled to the first light-emitting control terminal EM1, a first electrode electrically coupled to the fourth node N4, and a second electrode electrically coupled to a second power signal terminal VSS.

The fifth transistor T5 has a control electrode electrically coupled to the second light-emitting control terminal EM2, a first electrode electrically coupled to the fifth node N5, and a second electrode electrically coupled to the second power signal terminal VSS.

The first electrode of the first light-emitting element R is electrically coupled to the second node N2, the second electrode of the first light-emitting element R is electrically coupled to the first electrode of the second light-emitting element G via the fourth node N4, and the second electrode of the second light-emitting element G is electrically coupled to the first electrode of the third light-emitting element B via the fifth node N5.

FIG. 9 shows a schematic block diagram of a display panel 900 according to the embodiments of the present disclosure.

As shown in FIG. 9, the display panel 900 may include: a plurality of scan lines SL; a plurality of data lines DL arranged to cross the plurality of scan lines SL; and a plurality of pixel units 910 arranged at intersections of each scan line and each data line in a form of a matrix, and electrically coupled to respective data lines DL and scan lines SL. Each of the plurality of pixel units 910 is provided with a pixel circuit according to the embodiments of the present disclosure, for example, the pixel circuit shown in FIGS. 2A-2B, FIG. 3, FIG. 4, FIG. 5, FIG. 6 or FIG. 8.

When the display panel 900 of FIG. 9 is implemented by the pixel circuit shown in FIG. 4, FIG. 5, FIG. 6 or FIG. 8, the data signal terminal Data in the pixel circuit receives the data signal from the corresponding data line DL, and the scan signal terminal Scan in the pixel circuit receives the scan signal from the corresponding scan line SL.

The display panel 900 may be any product or component with a display function, such as an electronic paper, a mobile phone, a tablet computer, a television, a display, a notebook computer, a digital photo frame, a navigator, etc.

FIG. 10 shows a flowchart of a method 1000 for driving a pixel circuit according to the embodiments of the present disclosure. As described above, the driving of the pixel circuit is performed in a first period, a second period and a third period, and each period includes an initialization phase, a charging phase and a light-emitting phase.

The method 1000 includes step S1010 to step S1030.

In step S1010, in the light-emitting phase of the first period, a first light-emitting control signal being at a second level is provided, and a second light-emitting control signal and a third light-emitting control signal each being at a first level are provided.

In addition, in the initialization phase and the charging phase of the first period, a first light-emitting control signal, a second light-emitting control signal and a third light-emitting control signal each being at a first level are provided.

In the embodiments described in FIG. 6 or FIG. 8, the transistor is a P-type transistor, the first level is a high level, and the second level is a low level.

In step S1020, in the light-emitting phase of the second period, a second light-emitting control signal being at a second level is provided, and a first light-emitting control signal and a third light-emitting control signal each being at a first level are provided.

In addition, in the initialization phase and the charging phase of the second period, a first light-emitting control signal, a second light-emitting control signal and a third light-emitting control signal each being at a first level are provided.

In step S1030, in the light-emitting phase of the third period, a third light-emitting control signal being at a second level is provided, and a first light-emitting control signal and a second light-emitting control signal each being at a first level are provided.

In addition, in the initialization phase and the charging phase of the third period, a first light-emitting control signal, a second light-emitting control signal and a third light-emitting control signal each being at a first level are provided. The above detailed description has explained a number of embodiments by using schematic diagrams, flowcharts and/or examples. In a case that such schematic diagrams, flowcharts and/or examples contain one or more functions and/or operations, those skilled in the art should understand that each function and/or operation in such schematic diagrams, flowcharts or examples may be implemented individually and/or together through various structures, hardware, software, firmware or substantially any combination of them.

Although the present disclosure is described with reference to several conventional embodiments, it should be understood that the terms used are illustrative and exemplary rather than restrictive. Since the present disclosure may be implemented in various forms without departing from the spirit or essence of the present disclosure, it should be understood that the above-mentioned embodiments are not limited to any of the foregoing details, but should be interpreted broadly within the spirit and scope defined by the appended claims. Therefore, all changes and modifications falling within the scope of the claims or their equivalents shall be covered by the appended claims.

What is claimed is:

1. A pixel circuit, comprising:
a driving sub-circuit electrically coupled to a first node, a first power signal terminal and a second node, and configured to transmit a first power voltage at the first power signal terminal to the second node under control of a voltage at the first node; and
a light-emitting control sub-circuit electrically coupled to the second node, a second power signal terminal, a first light-emitting control terminal, a second light-emitting control terminal, a third light-emitting control terminal, a first electrode of a first light-emitting element, a second electrode of the first light-emitting element, a first electrode of a second light-emitting element, a second electrode of the second light-emitting element, a first electrode of a third light-emitting element and a second electrode of the third light-emitting element, and configured to: transmit a voltage at the second node and a second power voltage at the second power signal terminal to the first electrode of the first light-emitting element and the second electrode of the first light-emitting element respectively in a first period, transmit a voltage at the second node and a second power voltage at the second power signal terminal to the first electrode of the second light-emitting element and the second electrode of the second light-emitting element respectively in a second period, and transmit a voltage at the second node and a second power voltage at the second power signal terminal to the first electrode of the third light-emitting element and the second electrode of the third light-emitting element respectively in a third period, under control of a first light-emitting control signal from the first light-emitting control terminal, a second light-emitting control signal from the second light-emitting control terminal, and a third light-emitting control signal from the third light-emitting control terminal;
wherein the light-emitting control sub-circuit comprises:
a first transistor having a control electrode electrically coupled to the second light-emitting control terminal, a first electrode electrically coupled to the second node, and a second electrode electrically coupled to a fourth node;
a second transistor having a control electrode electrically coupled to the first light-emitting control terminal, a first electrode electrically coupled to the second node, and a second electrode electrically coupled to the first electrode of the first light-emitting element;
a third transistor having a control electrode electrically coupled to the third light-emitting control terminal, a first electrode electrically coupled to the second node, and a second electrode electrically coupled to a fifth node;
a fourth transistor having a control electrode electrically coupled to the first light-emitting control terminal, a first electrode electrically coupled to the fourth node, and a second electrode electrically coupled to the second power signal terminal; and
a fifth transistor having a control electrode electrically coupled to the second light-emitting control terminal, a first electrode electrically coupled to the fifth node, and a second electrode electrically coupled to the second power signal terminal,
wherein the second electrode of the first light-emitting element is electrically coupled to the first electrode of the second light-emitting element via the fourth node, the second electrode of the second light-emitting element is electrically coupled to the first electrode of the third light-emitting element via the fifth node, and the second electrode of the third light-emitting element is electrically coupled to the second power signal terminal,
wherein each of the first period, the second period and the third period comprises an initialization phase, a charging phase and a light-emitting phase,
wherein the first light-emitting control signal being at a second level, the second light-emitting control signal and the third light-emitting control signal each being at a first level are provided in the light-emitting phase of the first period;
the second light-emitting control signal being at the second level, the first light-emitting control signal and the third light-emitting control signal each being at the first level are provided in the light-emitting phase of the second period;
the third light-emitting control signal being at the second level, the first light-emitting control signal and the second light-emitting control signal each being at the first level are provided in the light-emitting phase of the third period; and
the first light-emitting control signal, the second light-emitting control signal and the third light-emitting control signal each being at the first level are provided in the initialization phase and the charging phase of each of the first period, the second period and the third period.

2. The pixel circuit according to claim 1, wherein the light-emitting control sub-circuit comprises:
a first transistor having a control electrode electrically coupled to the second light-emitting control terminal, a first electrode electrically coupled to the second node, and a second electrode electrically coupled to a fourth node;
a second transistor having a control electrode electrically coupled to the third light-emitting control terminal, a first electrode electrically coupled to the second electrode of the third light-emitting element, and a second electrode electrically coupled to the second power signal terminal;
a third transistor having a control electrode electrically coupled to the third light-emitting control terminal, a first electrode electrically coupled to the second node, and a second electrode electrically coupled to a fifth node;
a fourth transistor having a control electrode electrically coupled to the first light-emitting control terminal, a first electrode electrically coupled to the fourth node, and a second electrode electrically coupled to the second power signal terminal; and
a fifth transistor having a control electrode electrically coupled to the second light-emitting control terminal, a first electrode electrically coupled to the fifth node, and a second electrode electrically coupled to the second power signal terminal,
wherein the first electrode of the first light-emitting element is electrically coupled to the second node, the second electrode of the first light-emitting element is electrically coupled to the first electrode of the second light-emitting element via the fourth node, and the second electrode of the second light-emitting element is electrically coupled to the first electrode of the third light-emitting element via the fifth node.

3. The pixel circuit according to claim 1, wherein the driving sub-circuit comprises a sixth transistor having a control electrode electrically coupled to the first node, a first electrode electrically coupled to the first power signal terminal, and a second electrode electrically coupled to the second node.

4. The pixel circuit according to claim 1, further comprising:
   a storage sub-circuit electrically coupled between the first node and a third node;
   a charging control sub-circuit electrically coupled to a scan signal terminal, a data signal terminal, the first node, the second node and the third node, and configured to generate a voltage difference between the first node and the third node under control of a first scan voltage at the scan signal terminal; and
   a reset sub-circuit electrically coupled to a first reset control terminal, a second reset control terminal, the third node and a reset voltage signal terminal, and configured to reset the third node by using a reset voltage signal from the reset voltage signal terminal, under control of a first reset control signal from the first reset control terminal or a second reset control signal from the second reset control terminal.

5. The pixel circuit according to claim 4, wherein the storage sub-circuit comprises a first capacitor having a first terminal electrically coupled to the third node, and a second terminal electrically coupled to the first node.

6. The pixel circuit according to claim 4, wherein the charging control sub-circuit comprises:
   a seventh transistor having a control electrode electrically coupled to the scan signal terminal, a first electrode electrically coupled to the data signal terminal, and a second electrode electrically coupled to the third node; and
   an eighth transistor having a control electrode electrically coupled to the scan signal terminal, a first electrode electrically coupled to the first node, and a second electrode electrically coupled to the second node.

7. The pixel circuit according to claim 4, wherein the reset sub-circuit comprises:
   a ninth transistor having a control electrode electrically coupled to the first reset control terminal, a first electrode electrically coupled to the reset voltage signal terminal, and a second electrode electrically coupled to the third node; and
   a tenth transistor having a control electrode electrically coupled to the second reset control terminal, a first electrode electrically coupled to the reset voltage signal terminal, and a second electrode electrically coupled to the third node.

8. The pixel circuit according to claim 4, wherein the scan signal terminal is configured to receive a scan signal for a current row of pixels, the first reset control terminal is configured to receive a scan signal for a previous row of pixels, and the second reset control terminal is configured to receive a scan signal for a next row of pixels.

9. A display panel comprising a plurality of pixel units, wherein at least one pixel unit of the plurality of pixel units comprises the pixel circuit according to claim 1.

10. The display panel according to claim 9, wherein each of the at least one pixel unit comprises:
    a substrate;
    a control circuit layer arranged on the substrate, wherein the control circuit layer comprises the driving sub-circuit and the light-emitting control sub-circuit;
    an intermediate layer arranged on a side of the control circuit layer away from the substrate, and configured to cover the control circuit layer; and
    a first electrode layer, a first light-emitting layer, a second electrode layer, a second light-emitting layer, a third electrode layer, a third light-emitting layer and a fourth electrode layer sequentially stacked on the intermediate layer, wherein the first light-emitting layer, the second light-emitting layer and the third light-emitting layer are used as a first light-emitting element, a second light-emitting element and a third light-emitting element, respectively.

11. The display panel according to claim 10, wherein the substrate comprises a first area and a second area that do not overlap each other; and
    wherein projections of at least a part of the driving sub-circuit and at least a part of the light-emitting control sub-circuit on the substrate are located in the first area; and
    wherein projections of at least a part of the first electrode layer, the first light-emitting layer, at least a part of the second electrode layer, the second light-emitting layer, at least a part of the third electrode layer, the third light-emitting layer, and at least a part of the fourth electrode layer on the substrate are located in the second area.

12. The display panel according to claim 10, wherein each of the first electrode layer, the second electrode layer and the third electrode layer is electrically coupled to the light-emitting control sub-circuit through a through hole penetrating the intermediate layer.

13. The display panel according to claim 10, wherein the first electrode layer comprises an opaque material; and
    wherein the second electrode layer, the third electrode layer and the fourth electrode layer comprise a transparent material.

14. A display panel comprising a plurality of pixel units, wherein each of the plurality of pixel units comprises:
    a substrate;
    a control circuit layer arranged on the substrate;
    an intermediate layer arranged on a side of the control circuit layer away from the substrate; and
    a first electrode layer, a first light-emitting layer, a second electrode layer, a second light-emitting layer, a third electrode layer, a third light-emitting layer, and a fourth electrode layer sequentially stacked on the intermediate layer, wherein the first light-emitting layer, the second light-emitting layer and the third light-emitting layer are used as a first light-emitting element, a second light-emitting element and a third light-emitting element, respectively;
    wherein the control circuit layer comprises:
    a driving sub-circuit electrically coupled to a first node, a first power signal terminal and a second node, and configured to transmit a first power voltage at the first power signal terminal to the second node under control of a voltage at the first node; and
    a light-emitting control sub-circuit electrically coupled to the second node, a second power signal terminal, a first light-emitting control terminal, a second light-emitting control terminal, a third light-emitting control terminal, a first electrode of a first light-emitting element, a second electrode of the first light-emitting element, a first electrode of a second light-emitting element, a second electrode of the second light-emitting element, a first electrode of a third light-emitting element and a second electrode of the third light-emitting element, and configured to: transmit a voltage at the second node and a second power voltage at the second power signal terminal to the first electrode of the first light-emitting element and the second electrode of the first light-emitting element respectively in a first period, transmit a voltage at the second node and a second power voltage at the second power signal terminal to the first electrode of the second light-emitting element and the second electrode of the second light-emitting element respectively in a second period, and transmit a voltage at the second node and a second power voltage at the second power signal terminal to the first electrode of the third light-emitting element and the second electrode of the third light-emitting element respectively in a third period, under control of a first light-emitting control signal from the first light-emitting control terminal, a second light-emitting control signal from the second light-emitting control terminal, and a third light-emitting control signal from the third light-emitting control terminal;

wherein the light-emitting control sub-circuit comprises:

a first transistor having a control electrode electrically coupled to the second light-emitting control terminal, a first electrode electrically coupled to the second node, and a second electrode electrically coupled to a fourth node;

a second transistor having a control electrode electrically coupled to the first light-emitting control terminal, a first electrode electrically coupled to the second node, and a second electrode electrically coupled to the first electrode of the first light-emitting element;

a third transistor having a control electrode electrically coupled to the third light-emitting control terminal, a first electrode electrically coupled to the second node, and a second electrode electrically coupled to a fifth node;

a fourth transistor having a control electrode electrically coupled to the first light-emitting control terminal, a first electrode electrically coupled to the fourth node, and a second electrode electrically coupled to the second power signal terminal; and a fifth transistor having a control electrode electrically coupled to the second light-emitting control terminal, a first electrode electrically coupled to the fifth node, and a second electrode electrically coupled to the second power signal terminal, wherein the second electrode of the first light-emitting element is electrically coupled to the first electrode of the second light-emitting element via the fourth node, the second electrode of the second light-emitting element is electrically coupled to the first electrode of the third light-emitting element via the fifth node, and the second electrode of the third light-emitting element is electrically coupled to the second power signal terminal, wherein each of the first period, the second period and the third period comprises an initialization phase, a charging phase and a light-emitting phase, wherein the first light-emitting control signal being at a second level, the second light-emitting control signal and the third light-emitting control signal each being at a first level are provided in the light-emitting phase of the first period;

the second light-emitting control signal being at a second level, the first light-emitting control signal and the third light-emitting control signal each being at the first level are provided in the light-emitting phase of the second period;

the third light-emitting control signal being at the second level, the first light-emitting control signal and the second light-emitting control signal each being at the first level are provided in the light-emitting phase of the third period; and the first light-emitting control signal, the second light-emitting control signal and the third light-emitting control signal each being at the first level are provided in the initialization phase and the charging phase of each of the first period, the second period and the third period.

15. The display panel according to claim 14, wherein the substrate comprises a first area and a second area that do not overlap each other; and wherein projections of at least a part of the first electrode layer, the first light-emitting layer, at least a part of the second electrode layer, the second light-emitting layer, at least a part of the third electrode layer, the third light-emitting layer and at least a part of the fourth electrode layer on the substrate are located in the second area.

16. The display panel according to claim 14, wherein each of the first electrode layer, the second electrode layer and the third electrode layer is electrically coupled to the control circuit layer through a through hole penetrating the intermediate layer.

17. The display panel according to claim 14, wherein the first electrode layer comprises an opaque material, and the second electrode layer, the third electrode layer and the fourth electrode layer comprise a transparent material.

* * * * *